United States Patent
Koukami et al.

(10) Patent No.: US 9,826,623 B2
(45) Date of Patent: Nov. 21, 2017

(54) HEAT DISSIPATING STRUCTURE

(71) Applicant: KANEKA CORPORATION, Kita-ku, Osaka (JP)

(72) Inventors: Aki Koukami, Settsu (JP); Kazuo Hagiwara, Settsu (JP); Keisuke Oguma, Settsu (JP); Kazuhide Fujimoto, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 14/893,255

(22) PCT Filed: Dec. 12, 2013

(86) PCT No.: PCT/JP2013/083338
§ 371 (c)(1),
(2) Date: Nov. 23, 2015

(87) PCT Pub. No.: WO2014/188624
PCT Pub. Date: Nov. 27, 2014

(65) Prior Publication Data
US 2016/0157334 A1    Jun. 2, 2016

(30) Foreign Application Priority Data
May 22, 2013   (JP) ................ 2013-108198

(51) Int. Cl.
H05K 7/20   (2006.01)
H05K 1/02   (2006.01)
(Continued)

(52) U.S. Cl.
CPC ......... H05K 1/0209 (2013.01); H01L 23/295 (2013.01); H01L 23/3737 (2013.01);
(Continued)

(58) Field of Classification Search
CPC . G06F 1/181–1/182; H05K 7/20218–7/20381;
(Continued)

(56) References Cited

U.S. PATENT DOCUMENTS 3,987,373 A * 10/1976 Mohler ................ H01S 3/1062
                                                     372/107
5,789,279 A *  8/1998 Crema ................. H01L 23/367
                                                     257/E23.092
(Continued)

FOREIGN PATENT DOCUMENTS

JP     10135405 A    5/1998
JP    H10135405 A    5/1998
(Continued)

OTHER PUBLICATIONS

International Search Report corresponding to Application No. PCT/JP2013/083338; dated Mar. 18, 2014, with English translation.
(Continued)

*Primary Examiner* — Dimary Lopez Cruz
*Assistant Examiner* — Razmeen Gafur
(74) *Attorney, Agent, or Firm* — Cantor Colburn LLP (57) ABSTRACT

A heat dissipation structure including: a printed circuit board; a first heat-generating element; a second heat-generating element; and a cured product of a thermally conductive curable liquid resin composition, the printed circuit board having a first surface and a second surface that is opposite to the first surface, the first heat-generating element being placed on the first surface, the second heat-generating element being placed on the second surface, the first heat-generating element generating an equal or greater amount of heat than the second heat-generating element, the second heat-generating element being surrounded by the cured
(Continued)

product, the first heat-generating element being surrounded by a layer that has a lower thermal conductivity than the cured product.

9 Claims, 3 Drawing Sheets (51) Int. Cl.
*H01L 23/29* (2006.01)
*H01L 23/373* (2006.01)
*H05K 3/28* (2006.01)
*H05K 1/18* (2006.01)
*H01L 23/31* (2006.01)

(52) U.S. Cl.
CPC ............... *H05K 1/18* (2013.01); *H05K 3/284* (2013.01); *H01L 23/3121* (2013.01); *H01L 2924/0002* (2013.01); *H05K 2201/0104* (2013.01); *H05K 2201/06* (2013.01); *H05K 2201/10371* (2013.01); *H05K 2201/10545* (2013.01); *H05K 2203/1327* (2013.01)

(58) Field of Classification Search
CPC ............. H05K 7/20409–7/20418; H05K 7/20009–7/202; H05K 1/0209; H05K 1/18; H05K 3/284; H05K 2201/10371; H05K 2201/10545; H05K 2201/0104; H05K 2201/06; H05K 2203/1327; H05K 2924/0002; H01L 23/367–23/3677; H01L 23/473; H01L 23/46–23/467; H01L 23/295; H01L 23/3121; H01L 23/3737
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,223,814 B1* | 5/2001 | Moresco | ................... | F28F 3/02 165/185 |
| 2002/0187590 A1* | 12/2002 | Bolken | ............. | H01L 21/67132 438/118 |
| 2004/0081843 A1* | 4/2004 | Bunyan | ............... | H01L 23/4275 428/517 |
| 2005/0135065 A1* | 6/2005 | Nakatsu | ............. | H01L 23/4006 361/703 |
| 2005/0241801 A1* | 11/2005 | Mitchell | ............... | H01L 23/367 165/80.3 |
| 2006/0120058 A1* | 6/2006 | Fairchild | ................. | H01L 23/13 361/761 |
| 2008/0273307 A1* | 11/2008 | Campbell | ................. | G06F 1/20 361/699 |
| 2009/0027859 A1* | 1/2009 | Giacoma | ................. | H01L 21/50 361/709 |
| 2009/0086436 A1* | 4/2009 | Kluge | ................... | F21S 48/328 361/707 |
| 2009/0103267 A1* | 4/2009 | Wieland | ............. | H05K 7/20409 361/707 |
| 2010/0000655 A1* | 1/2010 | Ni | ........................ | H01L 23/3672 156/60 |
| 2010/0265663 A1* | 10/2010 | Yamashita | ............ | H01L 23/552 361/715 |
| 2010/0321892 A1* | 12/2010 | Vander Ploeg | ...... | H05K 7/1412 361/707 |
| 2011/0038124 A1* | 2/2011 | Burnham | ................ | C08L 63/00 361/717 |
| 2011/0068737 A1* | 3/2011 | Rai | ........................ | H05K 7/142 320/107 |
| 2011/0069448 A1* | 3/2011 | Weichslberger | .... | H01L 23/5389 361/688 |
| 2011/0141691 A1* | 6/2011 | Slaton | ................ | H05K 7/20145 361/690 |
| 2011/0205711 A1* | 8/2011 | Lischeck | ............ | H05K 7/20454 361/720 |
| 2011/0228484 A1* | 9/2011 | Sundstrom | .............. | H01L 23/36 361/718 |
| 2011/0242764 A1* | 10/2011 | Hill | ......................... | G06F 1/203 361/705 |
| 2011/0255247 A1* | 10/2011 | Chu | .................... | H01L 23/4093 361/709 |
| 2011/0286179 A1* | 11/2011 | Motschman | ............. | G06F 1/20 361/679.54 |
| 2012/0050999 A1* | 3/2012 | Cooper | ................. | H02M 7/003 361/722 |
| 2012/0094442 A1* | 4/2012 | Lin | ........................ | H05K 1/021 438/118 |
| 2012/0188708 A1* | 7/2012 | Ankireddi | ............. | H01L 23/367 361/679.54 |
| 2012/0250880 A1* | 10/2012 | Snider | ................... | H04B 1/082 381/86 |
| 2013/0003314 A1* | 1/2013 | Igarashi | ............... | H05K 3/4608 361/719 |
| 2013/0250520 A1* | 9/2013 | Taniguchi | ............ | H01L 23/045 361/707 |

FOREIGN PATENT DOCUMENTS

| | | |
|---|---|---|
| JP | 2002305271 A | 10/2002 |
| JP | 2004104115 A | 4/2004 |
| JP | 2005317792 A | 11/2005 |
| JP | 2008153704 | 7/2008 |
| JP | 2008270684 A | 11/2008 |
| JP | 2009016605 A | 1/2009 |
| JP | 2009059760 A | 3/2009 |
| JP | 2011126262 A | 6/2011 |
| JP | 2011165699 A | 8/2011 |
| JP | 2005317792 A | 11/2015 |

OTHER PUBLICATIONS

International Preliminiary Report on Patentability with Written Opinion of the International Searching Authority corresponding to Application No. PCT/JP2013/083338, dated Nov. 2015.

* cited by examiner

HEAT DISSIPATING STRUCTURE

This is the U.S. national stage of application No. PCT/JP2013/083338, filed on Dec. 12, 2013. Priority under 35 U.S.C. §119(a) and 35 U.S.C. §365(b) is claimed from Japanese Application No. 2013-108198, filed May 22, 2013, the disclosure of which is also incorporated herein by reference.

TECHNICAL FIELD

The present invention relates to a heat dissipation structure for use in electronic devices, precision apparatuses, or the like.

BACKGROUND ART

Electronic devices (e.g. PCs, cellphones, PDAs), lighting and display devices (e.g. LED, EL) and the like have recently made a significant improvement in performance. This improvement is attributed to a significant improvement in the performance of arithmetic elements and light-emitting elements. The improvement in the performance of arithmetic elements and light-emitting elements has been accompanied by a significant increase in the amount of heat generation, which may cause malfunctions in electronic devices and lighting and display devices or cause damage to electronic components. This poses the important challenge of how to dissipate heat from such elements. Further, from the standpoint of preventing burn injuries during the use of electronic devices such as PCs or cellphones, it is important for these devices to avoid conduction of heat to the outside in portions that come into contact with the human body, while conducting heat to portions that do not come into contact with the human body.

Known measures to dissipate heat from such electronic components as described above include techniques using a thermally conductive resin molded product as disclosed in Patent Literature 1, and techniques using a heat-dissipating sheet as disclosed in Patent Literatures 2 to 4. A problem associated with the use of molded products is that additional work is required to modify the mold and the like for each component. Moreover, since not only electric/electronic components but also other many heat-generating elements and heat-dissipating elements have non-smooth surfaces, heat dissipation components in the form of heat-dissipating sheets cannot be put in close contact with these heat-generating elements and heat-dissipating elements, and therefore the contact area with the heat-generating element or heat-dissipating element is reduced. On such printed circuit boards as described above, electronic components of various sizes from small to large are used, and therefore the heat dissipation components such as heat-dissipating sheets cannot conform to the fine irregularities. This reduction in contact area problematically causes a reduction in the efficiency of heat transfer from the heat-generating element to the heat-dissipating element, which does not allow the heat dissipation components to sufficiently exhibit their heat dissipation properties.

Moreover, Patent Literature 5 discloses a technique of embedding in a heat-dissipating resin electronic components on the front and back surfaces of a printed circuit board to reduce differences in heat dissipation and provide efficient heat dissipation. However, since the disclosed resin is a conductive rubber, an extra step of further providing an insulating layer to the front and back surfaces of the printed circuit board is required after application of the heat-dissipating resin. In addition, since the resin applied to the front and back surfaces of the printed circuit board transfers heat to all directions, the direction for heat dissipation cannot be controlled. The heat is therefore conducted to portions that come into contact with the human body during the use of the electronic device, which leads to the risk of burn injuries during the use.

Furthermore, Patent Literature 6 describes a heat dissipation technique for allowing heat to escape to a certain inside area to prevent thermal conduction to the outside. This technique includes connecting a base substrate to a heat-generating substrate on which electronic components are placed, so as to transfer heat generated by the electronic components to the base substrate. However, since this technique requires multiple substrates, it is difficult to make a space in the electronic devices desired to be miniaturized and reduced in thickness, and the design of these devices is also required to be greatly changed.

CITATION LIST

Patent Literature

Patent Literature 1: JP 2011-126262 A
Patent Literature 2: JP 2002-305271 A
Patent Literature 3: JP 2011-165699 A
Patent Literature 4: JP 2008-153704 A
Patent Literature 5: JP 2009-016605 A
Patent Literature 6: JP 2009-059760 A

SUMMARY OF INVENTION

Technical Problem

An object of the present invention is to provide a heat dissipation structure that allows heat from heat-generating elements (electronic components) to escape efficiently, without the need to change the design of the integrated circuit and its surrounding components, in the electric devices desired to be miniaturized and reduced in thickness, and that prevents a localized temperature increase on the surface of the electronic devices.

Solution to Problem

The present invention uses the following solutions to solve the above problems.
(1) A heat dissipation structure, including: (A) a printed circuit board; (B) a first heat-generating element; (C) a second heat-generating element; and (D) a cured product of a thermally conductive curable liquid resin composition, the printed circuit board (A) having a first surface and a second surface that is opposite to the first surface, the first heat-generating element (B) being placed on the first surface, the second heat-generating element (C) being placed on the second surface, the first heat-generating element (B) generating an equal or greater amount of heat than the second heat-generating element (C), the second heat-generating element (C) being surrounded by the cured product (D), the first heat-generating element (B) being surrounded by a layer that has a lower thermal conductivity than the cured product (D).
(2) The heat dissipation structure according to the item (1), further including (E) an electromagnetic shielding case.
(3) The heat dissipation structure according to the item (1) or (2), wherein the thermally conductive curable liquid resin composition is curable by moisture or heat.

(4) The heat dissipation structure according to any one of the items (1) to (3), wherein the thermally conductive curable liquid resin composition contains (I) a curable acrylic resin or a curable polypropylene oxide resin and (II) a thermally conductive filler, and has a viscosity of at least 30 Pa·s but not more than 3000 Pa·s and a thermal conductivity of 0.5 W/(m·K) or higher.

(5) The heat dissipation structure according to any one of the items (2) to (4), wherein the electromagnetic shielding case (E) is mounted on the second surface, and the cured product (D) is placed inside the electromagnetic shielding case (E) mounted on the second surface.

(6) The heat dissipation structure according to any one of the items (2) to (5), wherein, as seen in a perspective view in a direction perpendicular to the first surface of the printed circuit board (A), at least a part of a region where the first heat-generating element (B) is placed overlaps at least a part of a region where the second heat-generating element (C) and the cured product (D) are placed.

Advantageous Effects of Invention

The heat dissipation structure of the present invention can dissipate heat generated by electronic components placed on both sides of a printed circuit board, through a cured product of a thermally conductive curable liquid resin composition placed on the second surface, to control the thermal conduction direction, prevent overheating of the electronic components on the first surface, and prevent deterioration of the performance of the electronic components.

DESCRIPTION OF EMBODIMENTS

<Heat dissipation structure>

The heat dissipation structure of the present invention characteristically includes: (A) a printed circuit board; (B) a first heat-generating element; (C) a second heat-generating element; and (D) a cured product of a thermally conductive curable liquid resin composition, the printed circuit board (A) having a first surface and a second surface that is opposite to the first surface, the first heat-generating element (B) being placed on the first surface, the second heat-generating element (C) being placed on the second surface, the first heat-generating element (B) generating an equal or greater amount of heat than the second heat-generating element (C), the second heat-generating element (C) being surrounded by the cured product (D), the first heat-generating element (B) being surrounded by a layer that has a lower thermal conductivity than the cured product (D).

Herein, the cured product of a thermally conductive curable liquid resin composition is also referred to as thermally conductive cured product.

Moreover, the first surface of the printed circuit board is also referred to as the front side of the printed circuit board, and the second surface is also referred to as the back side of the printed circuit board.

The heat dissipation structure of the present invention includes a printed circuit board on both sides of which heat-generating elements are placed and in which a thermally conductive cured product is placed to surround the heat-generating element placed on the surface opposite to the heat-generating element from which heat is desired to be more dissipated.

From the standpoint of dissipating heat to the back side of the printed circuit board, the layer surrounding the first heat-generating element must have a lower thermal conductivity than the cured product (D) of a thermally conductive curable liquid resin composition. The thermal conductivity is preferably lower than 0.5 W/(m·K), more preferably lower than 0.4 W/(m·K), still more preferably lower than 0.3 W/(m·K). The thermal conductivity is measured at 23° C. Such a layer may be, for example, a resin layer, a layer of infill material other than resin, or a space layer (e.g. gas layer such as air, vacuum layer). The layer may also be in any state, such as a gas, liquid, solid, or vacuum. More specifically, the layer may be, for example, air, a gasket, a foam, or an underfill agent. In particular, from the standpoint of eliminating the need of additional steps and materials, it is preferably a space layer. Multiple layers differing in material or thermal conductivity may be provided.

<Printed circuit board (A)>

The printed circuit board used in the present invention is a component of an electric product on which electronic components for electronic devices or precision apparatuses are fixed and wired. The printed circuit board is not particularly limited as long as it forms an electronic circuit by fixing many electronic components (e.g. integrated circuits, resistors, capacitors) and connecting these components by wiring. Examples include rigid printed circuit boards with inflexible insulating materials, flexible printed circuit boards with thin, flexible materials as insulating substrates, and rigid-flexible printed circuit boards obtained by combining a hard material and a thin, flexible material.

Examples of the material of the printed circuit board include phenolic paper, epoxy paper, glass epoxy, glass fiber epoxy, glass composites, Teflon (registered trademark), ceramics, low temperature co-fired ceramics, polyimides, polyesters, metals, and fluorine.

Examples of the structure of the printed circuit board include single-sided boards with a pattern only on one side, double-sided boards with a pattern on each side, multilayer boards with insulators and patterns combined in a wafer form, and build-up boards in which layers are built up on each other. The printed circuit board may have any structure in which heat-generating elements can be placed.

Moreover, electronic components other than wires and heat-generating elements, and the like may be placed on the printed circuit board.

<Heat-generating elements (B), (C)>

The heat-generating elements (B) and (C) used in the present invention may each be any electronic component that generates heat when electronic devices or precision apparatuses are driven. Examples of the electronic components include semiconductor devices (e.g. transistors, integrated circuits (ICs), CPUs, diodes, LEDs), electronic tubes, electric motors, resistors, capacitors, coils, relays, piezoelectric elements, oscillators, speakers, heaters, various cells, and various chip components.

The heat-generating elements used in the present invention each refer to one with a heat density of 0.2 $W/cm^2$ or higher. Heat-generating elements with a heat density of 0.2 $W/cm^2$ or higher generate high temperature heat during driving and therefore the performance of the components can be easily deteriorated. In this case, the effects of the present invention can be sufficiently produced. The heat density is preferably 0.5 $W/cm^2$ or higher, while it is preferably 1000 $W/cm^2$ or lower, more preferably 800 $W/cm^2$ or lower. The heat density refers to thermal energy released per unit area per unit time.

A single or a plurality of heat-generating elements may be mounted on one surface. Moreover, when an electromagnetic shielding case is placed, the heat-generating element may be placed only inside the electromagnetic shielding case, or may further be placed outside the electromagnetic shielding case. A single or a plurality of heat-generating elements may also be mounted on one surface inside the electromagnetic shielding case. When a plurality of heat-generating elements are mounted on one surface, the heights of the heat-generating elements from the board are not necessarily the same.

The first heat-generating element used in the present invention generates an equal or greater amount of heat than the second heat-generating element.

The amount of heat generation can be determined from the heat density of a heat-generating element and the area of the portion in which heat is generated. When a plurality of heat-generating elements are placed on one surface, the sum of the amounts of heat generation of the heat-generating elements on the first surface is taken as the amount of heat generation of the first heat-generating element, while the sum of the amounts of heat generation of the heat-generating elements on the second surface is taken as the amount of heat generation of the second heat-generating element.

The amount of heat generation of the first heat-generating element is preferably 0.5 W or greater, more preferably 0.8 W or greater, still more preferably 1.0 W or greater, while it is preferably 1000 W or less, more preferably 900 W or less, still more preferably 800 W or less.

The amount of heat generation of the second heat-generating element is preferably 0.2 W or greater, more preferably 0.5 W or greater, still more preferably 0.8 W or greater, while it is preferably 1000 W or less, more preferably 900 W or less, still more preferably 800 W or less.

<Cured product (D) of thermally conductive curable liquid resin composition (thermally conductive cured product)>

In the heat dissipation structure of the present invention, the second heat-generating element is surrounded by the cured product of a thermally conductive curable liquid resin composition.

The area "surrounding" a heat-generating element means the area in the vicinity of the heat-generating element, to which the heat generated by the heat-generating element is conducted. More specifically, it refers to the surfaces of various components constituting an electronic device and the areas between the components. Examples of the components include printed circuit boards, heat-generating elements, electromagnetic shielding cases, wires, copper wires, copper plates, electronic components other than heat-generating elements, graphite sheets, and heat-dissipating pads.

The thermal conductivity of the cured product of a thermally conductive curable liquid resin composition used in the present invention is preferably 0.5 W/(m·K) or higher, more preferably 0.8 W/(m·K) or higher, still more preferably 1.0 W/(m·K) or higher, because a cured product with such a thermal conductivity enables efficient release of heat from the heat-generating element, resulting in an improvement in the performance of the electronic device. A cured product with a thermal conductivity of lower than 0.5 W/(m·K) may not be able to suitably dissipate heat, leading to problems such as deterioration of the performance of the heat-generating element and its surrounding components, and a shortened product life.

the thermal conductivity is measured at 23° C. Moreover, the thermal conductivity of the thermally conductive cured product is almost the same as the thermal conductivity of the thermally conductive curable liquid resin composition.

The thermally conductive cured product used in the present invention is preferably a rubber elastic body having a tensile elastic modulus of 50 MPa or lower, more preferably 40 MPa or lower. When the board is subjected to expansion or shrinkage or to compression or deformation by external pressure, a rubber elastic body with a tensile elastic modulus of higher than 50 MPa may not be able to follow these movements, resulting in cracks in the resin or damage to the components. The tensile elastic modulus refers to a tensile elastic modulus measured according to JIS K 6251.

Examples of the resin forming the rubber elastic body having a tensile elastic modulus of 50 MPa or lower include curable acrylic or methacrylic resins; curable polyether resins, typically curable polypropylene oxide resins; curable polyolefin resins, typically curable polyisobutylene resins; and silicone resins, as described later.

The thermally conductive cured product may have any shape, e.g., a sheet-like, tape-like, strip-like, disc-like, circular, block-like, or irregular shapes.

Moreover, multiple thermally conductive cured products differing in material or thermal conductivity may be provided.

Figure 7:
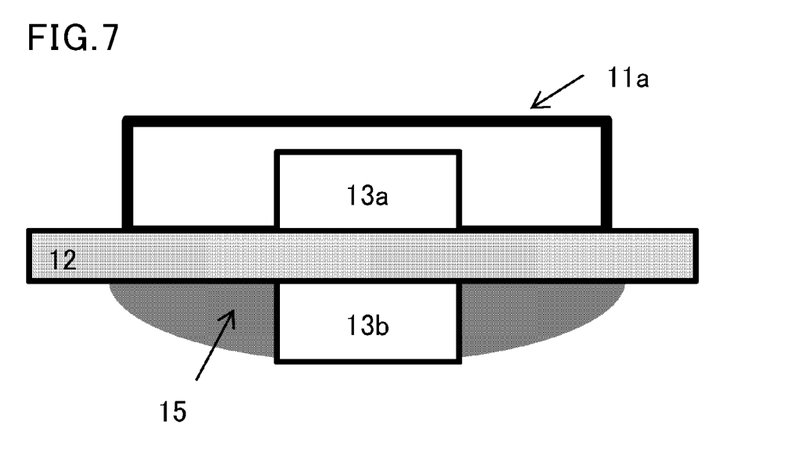
FIG. 7 is a schematic cross-sectional view of an example of a heat dissipation structure of the present invention.

The thermally conductive cured product surrounding the second heat-generating element may be placed to completely cover the heat-generating element, or may be placed such that a part of the heat-generating element is exposed as shown in FIG. 7. When a plurality of heat-generating elements are placed on one surface, all the heat-generating elements may be completely covered, some of the heat-generating elements may be exposed, or all the heat-generating elements may be exposed.

The thermally conductive cured product surrounding the second heat-generating element is preferably in contact with the heat-generating element. In the portion where the thermally conductive resin layer and the heat-generating element are in contact with each other, the thermally conductive resin layer and the heat-generating element are preferably in close contact with each other, because then an increased contact area is provided to achieve good heat dissipation.

For easy thermal conduction via the printed circuit board, the thermally conductive cured product is preferably further in contact with the printed circuit board.

In order for the heat generated by the first heat-generating element to be transferred rapidly, the distance between the thermally conductive cured product and the first heat-generating element is preferably short. Also, in order for the heat generated by the first heat-generating element to be transferred rapidly, as seen in a perspective view in the direction perpendicular to the first surface of the printed circuit board, at least a part of the region where the first heat-generating element is placed preferably overlaps at least a part of the region where the second heat-generating element and the thermally conductive cured product are placed.

When the thermally conductive cured product is placed inside an electromagnetic shielding case, the thermally conductive cured product may be in contact with the ceiling wall (portion facing the printed circuit board) or a side wall (portion other than the ceiling wall) of the electromagnetic shielding case. The heat generated by the heat-generating element can be transferred to the electromagnetic shielding case, so that an increase in the temperature of the heat-generating element can be prevented, which greatly contributes to prevention of performance deterioration.

<Thermally conductive curable liquid resin composition>

Since the thermally conductive curable liquid resin composition used in the present invention is in liquid form before being cured, it can conform to heat-generating elements of various sizes and heights from small to large and thus can be in closer contact therewith. Therefore, the thermal contact resistance with the heat-generating elements is small, and the generated heat can be released efficiently. Also, when an electromagnetic shielding case is filled with the resin composition, the resin composition can fill the case without any space and also there is no concern about loss of the composition to the outside of the system with time because the composition is cured.

The thermally conductive curable liquid resin composition used in the present invention is preferably curable by moisture or heat.

The thermally conductive curable liquid resin composition preferably contains (I) a curable acrylic resin or a curable polypropylene oxide resin and (II) a thermally conductive filler. The composition may optionally contain, in addition to these components, curing catalysts for curing the composition, anti-heat aging agents, plasticizers, extenders, thixotropy imparting agents, storage stabilizers, dehydrating agents, coupling agents, ultraviolet absorbers, flame retardants, electromagnetic wave absorbents, fillers, solvents, and the like.

The thermally conductive curable liquid resin composition preferably has a viscosity before curing of 30 Pa·s or higher, and is also preferably a liquid resin composition that is fluid but relatively highly viscous. The viscosity before curing is more preferably 40 Pa·s or higher, still more preferably 50 Pa·s or higher. The upper limit of the viscosity before curing is not particularly limited, but is preferably 5000 Pa·s or lower, more preferably 4000 Pa·s or lower, still more preferably 3000 Pa·s or lower. A viscosity before curing of lower than 30 Pa·s may cause the problem of reduced workability, such as leakage after application. A viscosity before curing of higher than 5000 Pa·s may cause difficulty in application, or may cause air to be trapped during application, which can reduce thermal conductivity. The viscosity before curing is measured at 23° C. and 50% RH with a BH viscometer at 2 rpm.

The thermal conductivity of the thermally conductive curable liquid resin composition is preferably 0.5 W/(m·K) or higher, more preferably 0.8 W/(m·K) or higher, still more preferably 1.0 W/(m·K) or higher.

<Curable acrylic resin or curable polypropylene oxide resin (I)>

The curable acrylic resin or curable polypropylene oxide resin is preferably a curable liquid resin that has a reactive group in the molecule. Examples of reactive groups include various reactive functional groups such as an epoxy group, a hydrolyzable silyl group, a vinyl group, an acryloyl group, a SiH group, a urethane group, a carbodiimide group, and a combination of a carboxylic anhydride group and an amino group.

In the case that the curable resin is curable via a combination of two types of reactive groups or by a reaction between a reactive group and a curing catalyst, the curable resin may be prepared into a two-pack type composition, which can then be cured by mixing the two components before application to the board or heat-generating element. The curable resin containing a hydrolyzable silyl group, which is curable by a reaction with moisture in the air, may be prepared into a one-pack type room temperature-curable composition. In the case of using, for example, a combination of a vinyl group, a SiH group, and a Pt catalyst, or a combination of a radical initiator and an acryloyl group, the curable resin may be prepared into a one-pack type or two-pack type curable composition, which can then be cured by heating to the crosslinking temperature or by applying crosslinking energy such as ultraviolet light or electron beams. In general, if the entire heat dissipation structure can be easily heated to a certain degree, it is preferred to use a heat-curable composition, while if the heat dissipation structure cannot be easily heated, it is preferred to prepare a two-pack type curable composition or a moisture-curable composition, though the present invention is not limited thereto.

The curable acrylic resin or curable polypropylene oxide resin is preferred because, for example, the problem of contamination inside the electronic device by low molecular weight siloxanes is less likely to occur and these resins have excellent heat resistance. Examples of the curable acrylic resin include various known reactive acrylic resins. Preferred among these are acrylic oligomers having a reactive group at a molecular end. Such a curable acrylic resin is most preferably a curable acrylic resin produced by living radical polymerization, and particularly by atom transfer radical polymerization, in combination with a curing catalyst. Kaneka XMAP available from Kaneka Corporation is a known example of such a resin. Moreover, examples of the curable polypropylene oxide resin include various known reactive polypropylene oxide resins, such as Kaneka MS polymer available from Kaneka Corporation. These curable liquid resins may be used alone or in combination of two or more.

<Thermally conductive filler (II)>

From various standpoints such as thermal conductivity, availability, ability to provide electrical characteristics (e.g. insulation properties, electromagnetic wave absorption properties), filling properties, and toxicity, preferred examples of the thermally conductive filler (II) include carbon compounds such as graphite and diamond; metal oxides such as aluminum oxide, magnesium oxide, beryllium oxide, titanium oxide, zirconium oxide, and zinc oxide; metal nitrides such as boron nitride, aluminum nitride, and silicon nitride; metal carbides such as boron carbide, aluminum carbide, and silicon carbide; metal hydroxides such as aluminum hydroxide and magnesium hydroxide; metal carbonates such as magnesium carbonate and calcium carbonate; crystalline silica; fired products of organic polymers, such as fired products of acrylonitrile polymers, fired products of furan resin, fired products of cresol resin, fired products of polyvinyl chloride, fired products of sugar, and fired products of charcoal; complex ferrites of Zn; Fe—Al—Si ternary alloys; and metal powder.

For improved dispersibility in resin, such a thermally conductive filler is preferably surface-treated by, for example, a silane coupling agent (e.g. vinylsilane, epoxysilane, (meth)acrylsilane, isocyanatosilane, chlorosilane, aminosilane) or a titanate coupling agent (e.g. alkoxy titanate, amino titanate), a fatty acid (e.g. a saturated fatty acid such as caproic acid, caprylic acid, capric acid, lauric acid, myristic acid, palmitic acid, stearic acid, and behenic acid; an unsaturated fatty acid such as sorbic acid, elaidic acid, oleic acid, linoleic acid, linolenic acid, and erucic acid), or a resin acid (e.g. abietic acid, pimaric acid, levopimaric acid, neoabietic acid, palustric acid, dehydroabietic acid, isopimaric acid, sandaracopimaric acid, communic acid, secodehydroabietic acid, dihydroabietic acid).

The amount of such a thermally conductive filler to be used is preferably 25 vol % or more of the total composition, in terms of volume ratio (%), in order to increase the thermal conductivity of the cured product of the thermally conductive curable liquid resin composition. An amount of less than 25 vol % tends to result in insufficient thermal conductivity. If higher thermal conductivity is desired, the amount of the thermally conductive filler used is more preferably 30 vol % or more, still more preferably 40 vol % or more, particularly preferably 50 vol % or more of the total composition. The volume ratio (%) of the thermally conductive filler is also preferably 90 vol % or less of the total composition. An amount of more than 90 vol % may excessively increase the viscosity of the thermally conductive curable liquid resin composition before curing.

The volume ratio (%) of the thermally conductive filler is calculated from the weight fractions and the specific gravities of the resin component and the thermally conductive filler using the equation below. Please note that the thermally conductive filler is simply described as "filler" in the following equation.

$$\text{Filler volume ratio (vol \%)} = \frac{\text{filler weight fraction}/\text{filler specific gravity}}{[(\text{resin component weight fraction}/\text{resin component specific gravity}) + (\text{filler weight fraction}/\text{filler specific gravity})]} \times 100$$

The resin component refers to all the components except the thermally conductive filler.

One suitable way of increasing the filling ratio of the thermally conductive filler relative to the resin is to use a combination of at least two types of thermally conductive fillers with different particle sizes. In this case, it is preferred that the particle size of the thermally conductive filler with a larger particle size is more than 10 μm, while the particle size of the thermally conductive filler with a smaller particle size is 10 μm or less.

The thermally conductive filler may be a single thermally conductive filler or may also be a combination of two or more different thermally conductive fillers.

<Electromagnetic shielding case (E)>

The heat dissipation structure of the present invention may include an electromagnetic shielding case. The electromagnetic shielding case refers to a case that exhibits electromagnetic shielding properties by reflecting, conducting, or absorbing electromagnetic waves.

The material of the electromagnetic shielding case (E) may be any material that exhibits electromagnetic shielding properties by reflecting, conducting, or absorbing electromagnetic waves. For example, metallic materials, plastic materials, various magnetic materials, and the like can be used, and in particular, metallic materials are suitable.

Suitable metallic materials are those made only of metallic elements. Examples of metallic elements for the metallic materials made of metallic elements include group 1 elements in the periodic table, such as lithium, sodium, potassium, rubidium, and cesium; group 2 elements in the periodic table, such as magnesium, calcium, strontium, and barium; group 3 elements in the periodic table, such as scandium, yttrium, lanthanoids (e.g. lanthanum, cerium), and actinoids (e.g. actinium); group 4 elements in the periodic table, such as titanium, zirconium, and hafnium; group 5 elements in the periodic table, such as vanadium, niobium, and tantalum; group 6 elements in the periodic table, such as chromium, molybdenum, and tungsten; group 7 elements in the periodic table, such as manganese, technetium, and rhenium; group 8 elements in the periodic table, such as iron, ruthenium, and osmium; group 9 elements in the periodic table, such as cobalt, rhodium, and iridium; group 10 elements in the periodic table, such as nickel, palladium, and platinum; group 11 elements in the periodic table, such as copper, silver, and gold; group 12 elements in the periodic table, such as zinc, cadmium, and mercury; group 13 elements in the periodic table, such as aluminum, gallium, indium, and thallium; group 14 elements in the periodic table, such as tin and lead; and group 15 elements in the periodic table, such as antimony and bismuth.

Also, examples of alloys include stainless steel, copper-nickel alloys, brass, nickel-chromium alloys, iron-nickel alloys, zinc-nickel alloys, gold-copper alloys, tin-lead alloys, silver-tin-lead alloys, nickel-chromium-iron alloys, copper-manganese-nickel alloys, and nickel-manganese-iron alloys.

Examples of various metallic compounds containing non-metallic elements together with metallic elements are not particularly limited, provided that they contain metallic elements or alloys as mentioned above and can exhibit electromagnetic shielding properties. Examples include metallic sulfides (e.g. copper sulfide); and metallic oxides and metallic complex oxides (e.g. iron oxide, titanium oxide, tin oxide, indium oxide, cadmium-tin oxide).

Suitable among the metallic materials are gold, silver, aluminum, iron, copper, nickel, stainless steel, and copper-nickel alloys.

Examples of the plastic materials include conductive plastics such as polyacethylene, polypyrrole, polyacene, polyphenylene, polyaniline, and polythiophene. Moreover, carbon materials such as graphite may be used.

Examples of the magnetic materials include soft magnetic powder, various ferrites, and zinc oxide whiskers. Suitable magnetic materials are ferromagnetic materials with ferromagnetism or ferrimagnetism. Specific examples include ferrites with high magnetic permeability, pure iron, silicon-containing iron, nickel-iron alloys, iron-cobalt alloys, amorphous metal materials with high magnetic permeability, iron-aluminum-silicon alloys, iron-aluminum-silicon-nickel alloys, and iron-chromium-cobalt alloys.

Figure 1:
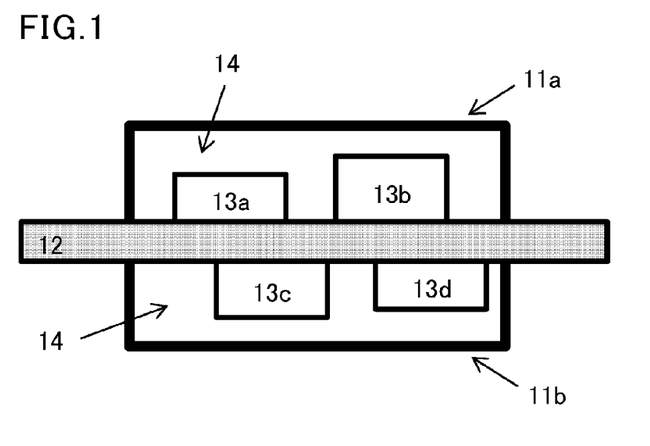
FIG. 1 is a schematic cross-sectional view illustrating an exemplary arrangement of a printed circuit board, electromagnetic shielding cases, and heat-generating elements in a heat dissipation structure of the present invention.
Figure 2:
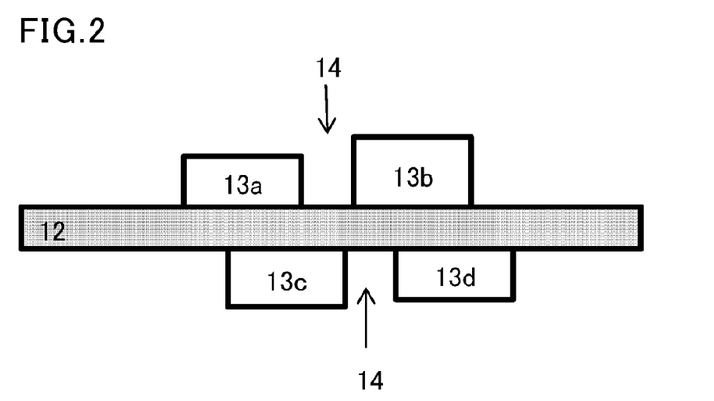
FIG. 2 is a schematic cross-sectional view illustrating an exemplary arrangement of a printed circuit board and heat-generating elements in a heat dissipation structure of the present invention.

The structure of the electromagnetic shielding case may be any structure capable of exhibiting electromagnetic shielding properties. Typically, the electromagnetic shielding case is placed on the ground layer on the printed circuit board as illustrated in FIG. 1, and covers electronic components that act as electromagnetic wave sources. The electromagnetic shielding case and the ground layer on the printed circuit board are typically bonded to each other with solder or a conductive material, for example. The electromagnetic shielding case may have holes or apertures as long as they do not deteriorate the electromagnetic shielding properties. Also, the electromagnetic shielding case is not necessarily an integrated product, and may have an upper portion separable like a lid or may be separable into two or more portions.

The electromagnetic shielding case may be mounted on only one of the first and the second surfaces of the printed circuit board, or may be mounted on both surfaces.

The heat-generating elements (electronic components) and the thermally conductive cured product may be placed inside or outside the electromagnetic shielding case.

When the electromagnetic shielding case is mounted on the second surface, the thermally conductive cured product is preferably placed inside the electromagnetic shielding case. This is because the electromagnetic shielding case and the inside thermally conductive cured product as a whole serve as a heat-dissipating component, thus providing efficient heat dissipation.

The electromagnetic shielding case preferably has as high a thermal conductivity as possible because higher thermal conductivity provides more uniform temperature distribution and more effective conduction of heat from the heat-generating element inside the electromagnetic shielding case to the outside. For enhanced heat dissipation, the thermal conductivity of the electromagnetic shielding case is preferably 1 W/(m·K) or higher, more preferably 3 W/(m·K) or higher, still more preferably 5 W/(m·K) or higher, most preferably 10 W/(m·K) or higher. The thermal conductivity of the electromagnetic shielding case is preferably 10000 W/(m·K) or lower.

<Electronic devices and precision apparatuses>

Electronic devices and precision apparatuses can be manufactured using the heat dissipation structure of the present invention. The electronic devices and precision apparatuses are not particularly limited as long as they include electronic components on a printed circuit board. Examples of the devices and apparatuses include devices such as servers, server computers, and desktop computers, gaming machines, portable devices such as laptops, electronic dictionaries, PDAs, cellphones, smartphones, tablet PCs, and portable music players, display devices such as liquid crystal displays, plasma displays, surface-conduction electron-emitter displays (SEDs), LEDs, organic EL, inorganic EL, liquid crystal projectors, and clocks and watches, image forming devices such as ink jet printers (ink heads) and electrophotographic devices (developing devices, fixing devices, heat rollers, heat belts), semiconductor-related parts such as semiconductor devices, semiconductor packages, semiconductor encapsulation cases, semiconductor die bonding devices, CPUs, memories, power transistors, and power transistor cases, wiring boards such as rigid wiring boards, flexible wiring boards, ceramic wiring boards, build-up wiring boards, and multi-layer boards (these wiring boards also include printed wiring boards and the like), manufacturing equipment such as vacuum processing devices, semiconductor manufacturing equipment, and display device manufacturing equipment, thermal insulation systems such as insulating materials, vacuum insulating materials, and radiation insulating materials, data recording devices such as DVDs (optical pickups, laser generation devices, laser receiving devices) and hard disk drives, image recording devices such as cameras, video cameras, digital cameras, digital video cameras, microscopes, and CCDs, and battery devices such as battery chargers, lithium-ion cells, fuel cells, and solar cells.

EXAMPLES

The embodiments and effects of the present invention will be explained below with reference to examples which, however, are not intended to limit the scope of the present invention.

<Evaluation>
(Viscosity of thermally conductive curable liquid resin composition)

The viscosity of thermally conductive curable liquid resin compositions was measured at 23° C. and 50% RH with a BH viscometer at 2 rpm.

(Thermal conductivity of thermally conductive curable liquid resin composition)

The thermally conductive curable liquid resin compositions were wrapped in Saran Wrap (registered trademark) and then measured for thermal conductivity at 23° C. using a hot disk thermal conductivity meter (TPA-501 available from Kyoto Electronics Manufacturing Co., Ltd.) by sandwiching a sensor (size: 4φ) between two specimens.

(Tensile elastic modulus of cured product of thermally Conductive Curable Liquid Resin Composition)

The tensile elastic modulus of mini dumbbell specimens prepared by curing the thermally conductive curable liquid resin compositions at 23° C. and 50% RH was measured in accordance with JIS K 6251.

(Measurement of temperatures of electronic component, board, and electromagnetic shielding case)

The simple models illustrated in FIGS. 3, 4, 5, and 6 were prepared, and the temperatures of the electronic components, board, and electromagnetic shielding cases of each model were measured with a Teflon (registered trademark)-insulated ultrafine duplex thermocouple wire (TT-D-40-SLE available from OMEGA Engineering Inc.). The temperature values were measured after the electronic component models were allowed to generate heat for one hour.

Figure 4:
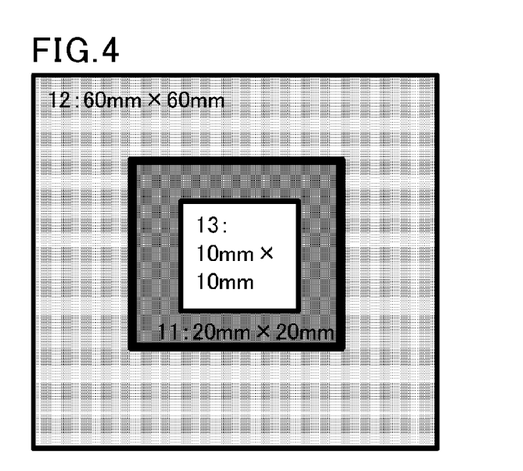
FIG. 4 is a schematic top view according to an example of the present invention.

In each model, the electronic components (13*a*, 13*b*) and the electromagnetic shielding cases (11*a*, 11*b*) were placed at the center of the board 12 as illustrated in FIG. 4. The thermocouple was mounted at the center of the upper surface of the electronic components and the electromagnetic shielding cases, and in the central portion of the board.

11*a*, 11*b*: Electromagnetic shielding case: SUS (thickness: 0.3 mm), 20 mm×20 mm×1.40 mm

12: Board: made of glass epoxy, 60 mm×60 mm×0.75 mm

13*a*: Electronic component (heat-generating element): alumina heat-generating element (heat density: 1 W/cm$^2$), 10 mm×10 mm×1.05 mm

13*b*: Electronic component (heat-generating element): alumina heat-generating element (heat density: 0.2 W/cm$^2$ or 0.9 W/cm$^2$), 10 mm×10 mm×1.05 mm

15: Thermally conductive cured product

Symbol O: Thermocouple mounting position (Synthesis 1)

In a nitrogen atmosphere, a 250-L reactor was charged with CuBr (1.09 kg), acetonitrile (11.4 kg), butyl acrylate (26.0 kg), and diethyl 2,5-dibromoadipate (2.28 kg), and the mixture was stirred at 70° C. to 80° C. for about 30 minutes. Then, pentamethyldiethylenetriamine was added to the mixture and a reaction was started. After 30 minutes from the start of the reaction, butyl acrylate (104 kg) was continuously added to the mixture over two hours. During the reaction, pentamethyldiethylenetriamine was added as needed so that the internal temperature was maintained at 70° C. to 90° C. The total amount of pentamethyldiethylenetriamine used up to this point was 220 g. After four hours from the start of the reaction, the mixture was heated with stirring under reduced pressure at 80° C. to remove volatile matter. Thereto were added acetonitrile (45.7 kg), 1,7-octadiene (14.0 kg), and pentamethyldiethylenetriamine (439 g), and the mixture was continuously stirred for 8 hours. The mixture was heated with stirring under reduced pressure at 80° C. to remove volatile matter.

To the resulting concentrate was added toluene to dissolve the polymer therein, followed by adding diatomaceous earth as a filtering aid and aluminum silicate and hydrotalcite as adsorbents. The mixture was then heated with stirring in an oxygen-nitrogen mixed gas atmosphere (oxygen concentration: 6%) at an internal temperature of 100° C. The solids in the mixture were removed by filtering, and the filtrate was heated with stirring under reduced pressure at an internal temperature of 100° C. to remove volatile matter.

To the resulting concentrate were further added aluminum silicate and hydrotalcite as adsorbents and an anti-heat aging agent, and the mixture was heated with stirring under reduced pressure (average temperature: about 175° C.; degree of vacuum: 10 Torr or lower).

Further, aluminum silicate and hydrotalcite were added as adsorbents and an antioxidant was also added. Then, the resulting mixture was heated with stirring in an oxygen-nitrogen mixed gas atmosphere (oxygen concentration: 6%) at an internal temperature of 150° C.

To the resulting concentrate was added toluene to dissolve the polymer therein. Then the solids in the mixture were removed by filtering, and the filtrate was heated with stirring under reduced pressure to remove volatile matter. Thus, a polymer containing an alkenyl group was obtained.

The polymer containing an alkenyl group, dimethoxymethylsilane (2.0 molar equivalents to the alkenyl group), methyl orthoformate (1.0 molar equivalent to the alkenyl group), and a platinum catalyst (a xylene solution of bis(1,3-divinyl-1,1,3,3-tetramethyldisiloxane)-platinum complex catalyst; hereinafter referred to as platinum catalyst) (10 mg, calculated as platinum per kilogram of polymer) were mixed, and the mixture was heated with stirring at 100° C. in a nitrogen atmosphere. After confirmation of the disappearance of the alkenyl group, the reaction mixture was concentrated to provide a poly(n-butyl acrylate) resin (I-1) having a dimethoxysilyl group at a chain end. The obtained resin had a number average molecular weight of about 26000 and a molecular weight distribution of 1.3. The average number of silyl groups introduced per molecule of resin was about 1.8 as determined by $^1$H NMR analysis.
(Synthesis 2)

Using polyoxypropylenediol with a number average molecular weight of about 2000 as an initiator, propylene oxide was polymerized in the presence of a zinc hexacyanocobaltate-glyme complex catalyst to obtain a polypropylene oxide having a number average molecular weight of 25500 (as measured using a solvent delivery system (HLC-8120 GPC available from Tosoh Corporation), a column (TSK-GEL H type available from Tosoh Corporation), and a solvent (THF) calibrated with polystyrene standards). Subsequently, 1.2 equivalents of NaOMe in methanol was added to the hydroxy groups of the hydroxy-terminated polypropylene oxide and the methanol was distilled off. Then, the terminal hydroxy groups were converted into allyl groups by adding allyl chloride. Unreacted allyl chloride was removed under reduced pressure. Then 100 parts by weight of the resulting crude allyl-terminated polypropylene oxide was combined with 300 parts by weight of n-hexane and 300 parts by weight of water. After stirring, the water was removed from the mixture by centrifugation. The resulting hexane solution was further combined with 300 parts by weight of water, followed by stirring. After the water was removed again by centrifugation, the hexane was removed under reduced pressure. Thus, an allyl-terminated bifunctional polypropylene oxide having a number average molecular weight of about 25500 was obtained.

Then 100 parts by weight of the obtained allyl-terminated polypropylene oxide was reacted with 0.95 parts by weight of trimethyoxysilane at 90° C. for five hours in the presence of 150 ppm of an isopropanol solution of platinum-vinylsiloxane complex (platinum content: 3 wt %) as a catalyst. Thus, a trimethoxysilyl-terminated polyoxypropylene polymer (I-2) was obtained. The average number of terminal trimethoxysilyl groups per molecule was 1.3 as determined by $^1$H NMR in the same manner as above.

Examples 1 and 2

The resin (I-1) obtained in Synthesis 1 (90 parts by weight), the resin (I-2) obtained in Synthesis 2 (10 parts by weight), a plasticizer (Monocizer W-7010 available from DIC; 100 parts by weight), an antioxidant (Irganox 1010; 1 part by weight), and thermally conductive fillers (450 parts by weight aluminum hydroxide, and 100 parts by weight zinc oxide) were sufficiently stirred and kneaded by hand. Then the mixture was dehydrated in vacuo while being kneaded under heat with a 5-L butterfly mixer. After completion of the dehydration, the mixture was cooled and mixed with a dehydrating agent (A171; 2 parts by weight) and curing catalysts (tin neodecanoate and neodecanoic acid; 4 parts by weight each). Thus, a thermally conductive curable liquid resin composition was obtained. After the obtained thermally conductive curable liquid resin composition was measured for viscosity and thermal conductivity, the thermally conductive curable liquid resin composition was filled as shown in the simple model of FIG. 6 to prepare a heat dissipation structure. Then, the temperatures were evaluated. The results are shown in Table 1.

The thermally conductive curable liquid resin composition had a viscosity of 350 to 400 Pa·s and a thermal conductivity of 1.1 W/(m·K). The cured product had a tensile elastic modulus of 2.0 MPa.

Comparative Examples 1 and 4

The evaluation procedure described in Examples 1 and 2 was followed without the use of the thermally conductive curable liquid resin composition. The evaluation results are shown in Table 1.

Comparative Examples 2 and 5

Figure 3:
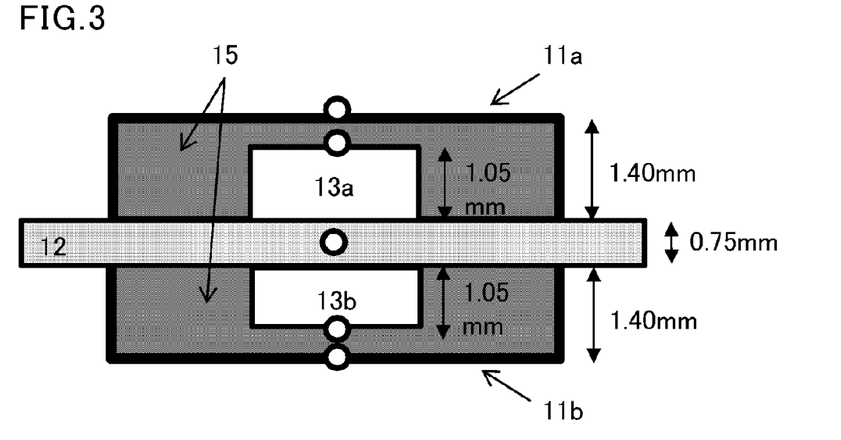
FIG. 3 is a schematic cross-sectional view according to a comparative example of the present invention.

A heat dissipation structure was prepared and evaluated in the same manner as in Examples 1 and 2, except that the thermally conductive curable liquid resin composition was filled as shown in the simple model of FIG. 3. The evaluation results are shown in Table 1.

Comparative Example 3

Figure 5:
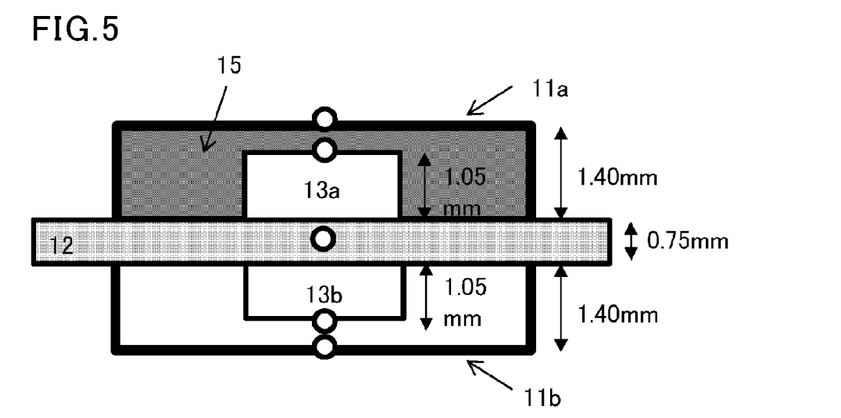
FIG. 5 is a schematic cross-sectional view according to another comparative example of the present invention.
Figure 6:
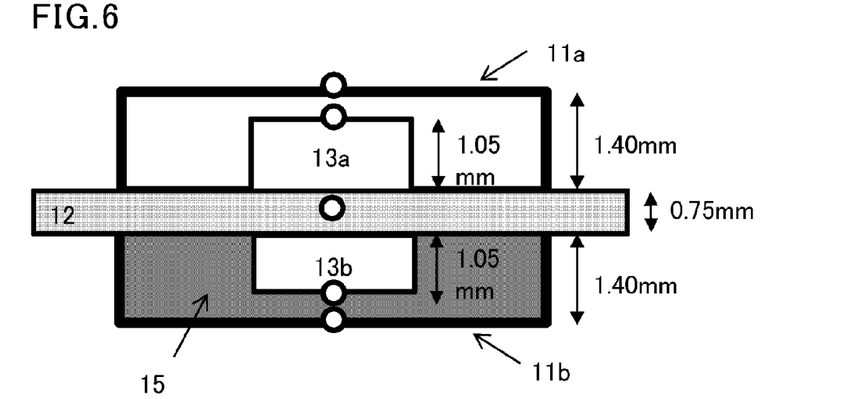
FIG. 6 is a schematic cross-sectional view according to an example of the present invention.

A heat dissipation structure was prepared and evaluated in the same manner as in Examples 1 and 2, except that the thermally conductive curable liquid resin composition was filled as shown in the simple model of FIG. 5. The evaluation results are shown in Table 1.

Examples 3 and 4

The evaluation procedure described in Examples 1 and 2 was followed but using a thermally conductive curable silicone resin composition (KE-4918 available from Shin-Etsu Chemical Co., Ltd., paste form, moisture-curable composition, thermal conductivity: 0.9 W/(m·K)) in place of the thermally conductive curable liquid resin composition used in Examples 1 and 2. The evaluation results are shown in Table 1.

TABLE 1

| | | Example 1 | Comparative Example 1 | Comparative Example 2 | Comparative Example 3 | Example 2 | Comparative Example 4 | Comparative Example 5 | Example 3 | Example 4 |
|---|---|---|---|---|---|---|---|---|---|---|
| Amount of heat generation (W) | Electronic component 13a | 1.0 | 1.0 | 1.0 | 1.0 | 1.0 | 1.0 | 1.0 | 1.0 | 1.0 |
| | Electronic component 13b | 0.2 | 0.2 | 0.2 | 0.2 | 0.9 | 0.9 | 0.9 | 0.2 | 0.9 |
| Filling | Electromagnetic shielding case 11a | Not filled | Not filled | Filled | Filled | Not filled | Not filled | Filled | Not filled | Not filled |
| | Electromagnetic shielding case 11b | Filled | Not filled | Filled | Not filled | Filled | Not filled | Filled | Filled | Filled |
| Measured temperature (° C.) | Electromagnetic shielding case 11a | 50.4 | 50.8 | 54.4 | 56.4 | 54.1 | 55.7 | 68.1 | 50.6 | 54.4 |
| | Electronic component 13a | 55.3 | 55.8 | 54.6 | 56.7 | 83.4 | 91.5 | 73.6 | 55.5 | 85.1 |
| | Board 12 | 53.5 | 54.2 | 52.6 | 53.2 | 76.6 | 85.1 | 69.9 | 53.3 | 78.3 |
| | Electronic component 13b | 52.5 | 53.6 | 51.9 | 52.6 | 74.3 | 84.8 | 68.5 | 52.8 | 77.0 |
| | Electromagnetic shielding case 11b | 52.3 | 48.6 | 48.1 | 48.1 | 68.8 | 54.2 | 64.1 | 51.5 | 65.4 |

Example 1 and Comparative Examples 1 to 3 are the cases where there is a great difference in amount of heat generation between two heat-generating elements. In Comparative Examples 2 and 3, the temperature of the electromagnetic shielding case 11a placed on the surface with an electronic component generating a great amount of heat was increased compared to Comparative Example 1, whereas the temperature in Example 1 was lower than that in Comparative Example 1. These results show that when the thermally conductive cured product was placed only on the side with an electronic component generating a small amount of heat, the cured product inhibited conduction of heat generated by the electronic component generating a large amount of heat to the electromagnetic shielding case 11a. Further in Example 1, the cured product was found to inhibit a temperature increase of the electronic component 13a.

Example 2 and Comparative Examples 4 and 5 are the cases where there is almost no difference in amount of heat generation between two heat-generating elements. Also in these cases, the temperature of the electromagnetic shielding case 11a in Comparative Example 5 was greatly increased compared to Comparative Example 4, whereas the temperature in Example 2 was lower than that in Comparative Example 4. Thus, the thermally conductive cured product was found to inhibit a temperature increase on the side without the cured product. Further in Example 2, the cured product was also found to inhibit a temperature increase of the electronic component 13a.

It is demonstrated that Examples 3 and 4 in which the thermally conductive silicone resin composition was used also achieved the same effect as in Examples 1 and 2.

The results of these examples and comparative examples demonstrate that when the thermally conductive cured product was placed on the back side of the printed circuit board, opposite to the heat-generating element generating a great amount of heat placed on the front side of the printed circuit board, from which heat was desired to be more dissipated, a temperature increase of the ceiling wall of the electromagnetic shielding case, i.e., a temperature increase in the area above the heat-generating element, from which heat was desired to be dissipated, was inhibited and, at the same time, a temperature increase of the heat-generating element was also inhibited. This means that the heat transfer direction can be controlled by the position of the thermally conductive cured product.

REFERENCE SIGNS LIST 11, 11a, 11b Electromagnetic shielding case
12 Printed circuit board
13, 13a, 13b, 13c, 13d Electronic component (heat-generating element)
14 Surrounding area of heat-generating element (space where cured product of thermally conductive curable liquid resin composition may be placed)
15 Cured product of thermally conductive curable liquid resin composition

The invention claimed is:
1. A heat dissipation structure, comprising:
(A) a printed circuit board;
(B) a first heat-generating element;
(C) a second heat-generating element; and
(D) a cured product of a thermally conductive curable liquid resin composition,
the printed circuit board (A) having a first surface and a second surface that is opposite to the first surface,
the first heat-generating element (B) being placed on the first surface, the second heat-generating element (C) being placed on the second surface,
the first heat-generating element (B) generating an equal or greater amount of heat than the second heat-generating element (C),
the second heat-generating element (C) being surrounded by the cured product (D),
the first heat-generating element (B) being surrounded by a layer that has a lower thermal conductivity than the cured product (D); and
wherein, as seen in a perspective view in a direction perpendicular to the first surface of the printed circuit board (A), at least a part of a region where the first heat-generation element (B) is placed overlaps at least a part of a region where the second heat-generating element (C) and the cured product (D) are placed.

2. The heat dissipation structure according to claim 1, wherein the thermally conductive curable liquid resin composition is curable by moisture or heat.

3. The heat dissipation structure according to claim 1, wherein the thermally conductive curable liquid resin composition comprises (I) a curable acrylic resin or a curable polypropylene oxide resin and (II) a thermally conductive filler, and has a viscosity of at least 30 Pa·s but not more than 3000 Pa·s and a thermal conductivity of 0.5 W/(m·K) or higher.

4. A heat dissipation structure, comprising:
(A) a printed circuit board;
(B) a first heat-generating element;
(C) a second heat-generating element;
(D) a cured product of a thermally conductive curable liquid resin composition; and
(E) an eletromagnetic shielding case
the printed circuit board (A) having a first surface and a second surface that is opposite to the first surface,
the first heat-generating element (B) being placed on the first surface, the second heat-generating element (C) being placed on the second surface,
the first heat-generating element (B) generating an equal or greater amount of heat than the second heat-generating element (C),
the second heat-generating element (C) being surrounded by the cured product (D),
the first heat-generating element (B) being surrounded by a layer that has a lower thermal conductivity than the cured product (D);
wherein the electromagnetic shielding case (E) is mounted on the second surface, and the cured product (D) is placed inside the electromagnetic shielding case (E) mounted on the second surface.

5. The heat dissipation structure according to claim 4, wherein the thermally conductive curable liquid resin composition is curable by moisture or heat.

6. The heat dissipation structure according to claim 4, wherein the thermally conductive curable liquid resin composition comprises (I) a curable acrylic resin or a curable polypropylene oxide resin and (II) a thermally conductive filler, and has a viscosity of at least 30 Pa·s but not more than 3000 Pa·s and a thermal conductivity of 0.5 W/(m·K) or higher.

7. A heat dissipation structure, comprising:
(A) a printed circuit board,
(B) a first heat-generating element;
(C) a second heat-generating element;
(D) a cured product of a thermally conductive curable liquid resin composition; and
(E) an electromagnetic shielding case
the printed circuit board (A) having a first surface and a second that is opposite to the first surface,
the first heat-generating element (B) being placed on the first surface, the second heat-generating element (C) being placed on the second surface,
the first heat-generating element (B) generating an equal or greater amount of heat than the second heat-generating element (C),
the second heat-generating element (C) being surrounded by the cured product (D),
the first heat-generating element (B) being surrounded by a layer that has a lower thermal conductivity than the cured product (D);
wherein, as seen in a perspective view in a direction perpendicular to the first surface of the printed circuit board (A), at least a part of a region where the first heat-generating element (B) is placed overlaps at least a part of a region where the second heat-generating element (C) and the cured product (D) are placed.

8. The heat dissipation structure according to claim 7, wherein the thermally conductive curable liquid resin composition is curable by moisture or heat.

9. The heat dissipation structure according to claim 7, wherein the thermally conductive curable liquid resin composition comprises (I) a curable acrylic resin or a curable polypropylene oxide resin and (II) a thermally conductive filler, and has a viscosity of at least 30 Pa·s but not more than 3000 Pa·s and a thermal conductivity of 0.5 W/(m·K) or higher.

* * * * *